(12) United States Patent
Gattuso

(10) Patent No.: US 8,435,046 B2
(45) Date of Patent: May 7, 2013

(54) ELECTRICAL ASSEMBLY HAVING AN ORBICULAR UPPER CONTACT HELD MOVABLY IN AN UPWARDLY COVERGING OPENING OF A LOWER CONTACT

(75) Inventor: Andrew David Gattuso, Chandler, AZ (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/204,717

(22) Filed: Aug. 8, 2011

(65) Prior Publication Data

US 2013/0040472 A1    Feb. 14, 2013

(51) Int. Cl.
*H01R 12/00*    (2006.01)

(52) U.S. Cl.
USPC .......................................................... 439/71

(58) Field of Classification Search ............... 439/66, 439/71, 70, 857, 948
See application file for complete search history.

(56) References Cited

U.S. PATENT DOCUMENTS

| | | | |
|---|---|---|---|
| 5,221,209 A | 6/1993 | D'Amico | |
| 5,362,241 A * | 11/1994 | Matsuoka et al. | 439/66 |
| 6,241,560 B1 * | 6/2001 | Furusawa et al. | 439/700 |
| 7,025,602 B1 | 4/2006 | Hwang | |
| 7,201,584 B1 * | 4/2007 | Ju et al. | 439/71 |
| 7,927,109 B1 * | 4/2011 | Gattuso | 439/66 |
| 7,938,649 B2 * | 5/2011 | Gattuso | 439/71 |

* cited by examiner

*Primary Examiner* — Chandrika Prasad
(74) *Attorney, Agent, or Firm* — Wei Te Chung; Ming Chieh Chang

(57) ABSTRACT

An electrical device for electrically connection an electronic component, comprises a substrate, and a plurality of contact units mounted on the substrate. The contact units each comprises a lower contact positioned on the substrate and an upper contact coupled to the lower contact. The upper contact is floatably received in a receiving space defined by the lower contact and upward and downward movement of the upper contact relative to the lower contact are limited by the lower contact.

4 Claims, 5 Drawing Sheets

ELECTRICAL ASSEMBLY HAVING AN ORBICULAR UPPER CONTACT HELD MOVABLY IN AN UPWARDLY COVERGING OPENING OF A LOWER CONTACT

BACKGROUND OF THE INVENTION

1. Field of the Invention

The present invention relates to a socket connector, and more particularly to a socket connector incorporated with contact terminal having self-repelling tip which can be pushed into a nest when a load is applied, and extended outwardly once the load is released.

2. Description of the Prior Art

Electrical socket with two-piece contact units is widely used for electrically connecting two electronic components because it can easily connect with electronic components. The contact unit is generally comprising an upper contact and a lower contact assembled with the upper contact. Usually, the lower contact is retained in passageway of the electrical socket and the upper contact is moveable relative to the lower contact in vertical direction. When the electrical socket is coupled to the electronic components, the upper contact is moved downwardly toward the lower contact under pressure from the electronic component. Therefore, loading force ensuring the component contacting with the contact unit is comparably low. A typical socket with two-piece contact units is found in U.S. Pat. No. 5,221,209 issued to Amico on Jun. 22, 1993.

However, the upper contact is received in the insulative housing of the electrical socket and limited by inner wall of the housing. Additionally, sometimes, the housing further comprises a lower housing portion for retaining the lower contact, and an upper housing seated upon the lower housing for receiving and limiting upward movement of the upper contact. Obviously, the structure of the electrical socket is too complicated.

U.S. Pat. No. 7,025,602 issued to Hwang on Apr. 11, 2006 also discloses a two-piece contact unit for electrical device. The contact unit comprises an upper contact pin, a lower contact pin and a spring fitted over a predetermined area between the upper and lower contact pin. The contact uses the spring as a resilient biasing member for urging the upper contact back to its original position after force acted on the contact is released. Obviously, the contact has a complicated structure.

Therefore, it is needed to find a new socket assembly to overcome the problems mentioned above.

SUMMARY OF THE INVENTION

Accordingly, an object of the present invention is to provide an electrical device for connecting two electronic components, which comprises a plurality of contact units each with self-releasing arrangement between an upper contact and a lower contact, thus making the contact unit and the electrical device having a simple structure and a lower manufacturing cost.

In order to achieve the object set forth, an electrical device for electrically connection an electronic component, comprises a substrate, and a plurality of contact units mounted on the substrate. The contact units each comprises a lower contact positioned on the substrate and an upper contact coupled to the lower contact. The upper contact is floatably received in a space defined by the lower contact and upward and downward movement of the upper contact relative to the lower contact are limited by the lower contact.

DESCRIPTION OF PREFERRED EMBODIMENT

Figure 1:
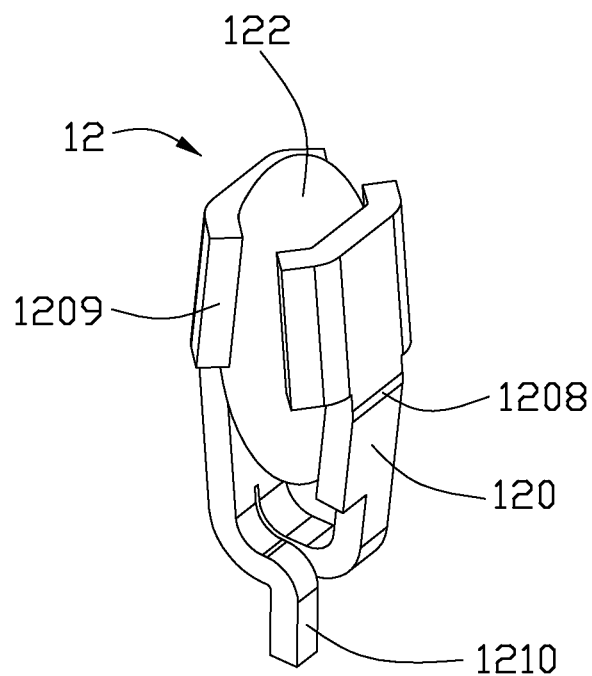
FIG. 1 is an assembly view of the contact unit of the present invention.
Figure 2:
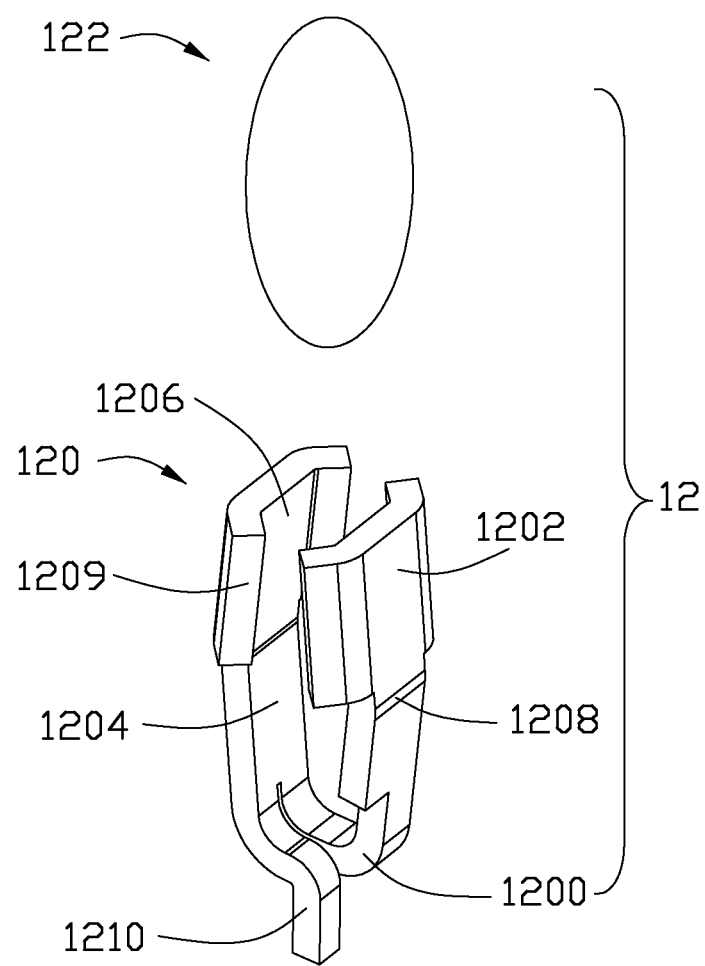
FIG. 2 is an exploded view of the contact unit of the present invention.

Reference will now be made to the drawings to describe the present invention in detail.

Referring to FIGS. 1-4, the electrical device 1 in accordance with a first embodiment of the present invention for electrically connecting with an electronic component 2 comprises a substrate 10 (e.g. a PCB), and a number of contact units 12 mounted on the substrate 10.

The contact unit 12 comprises a lower contact 120, an upper contact 122. The lower contact 120 comprises a base portion 1200 and two arms 1202 extending upwardly from opposite edges of the base portion 1200 to jointly create a nest. The arms 1202 each comprises a first section 1204 extending upwardly and away from the other arm, and a second section 1206 extending upwardly and bending toward the other arm from a end of the first section 1204. Therefore, a peak 1208 is formed between the first section 1204 and the second section 1206. Obviously, distance between the two peaks 1208 of the two arms 1202 is larger than maximum width of the upper contact 122. Therefore, the two arms 1202 define a receiving space allowing the upper contact 122 to be received therein.

Figure 3:
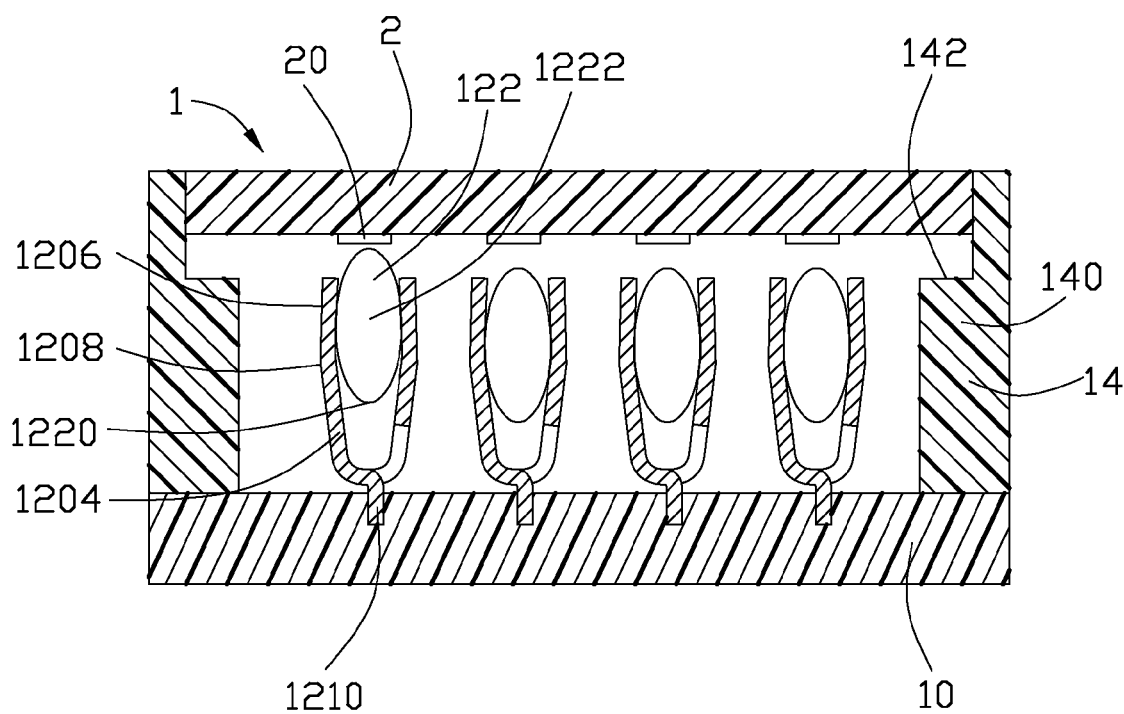
FIG. 3 is an isometric cross-sectional view of the electrical device in accordance with a first embodiment of the present invention, wherein an electronic component is ready to be mounted thereon.
Figure 4:
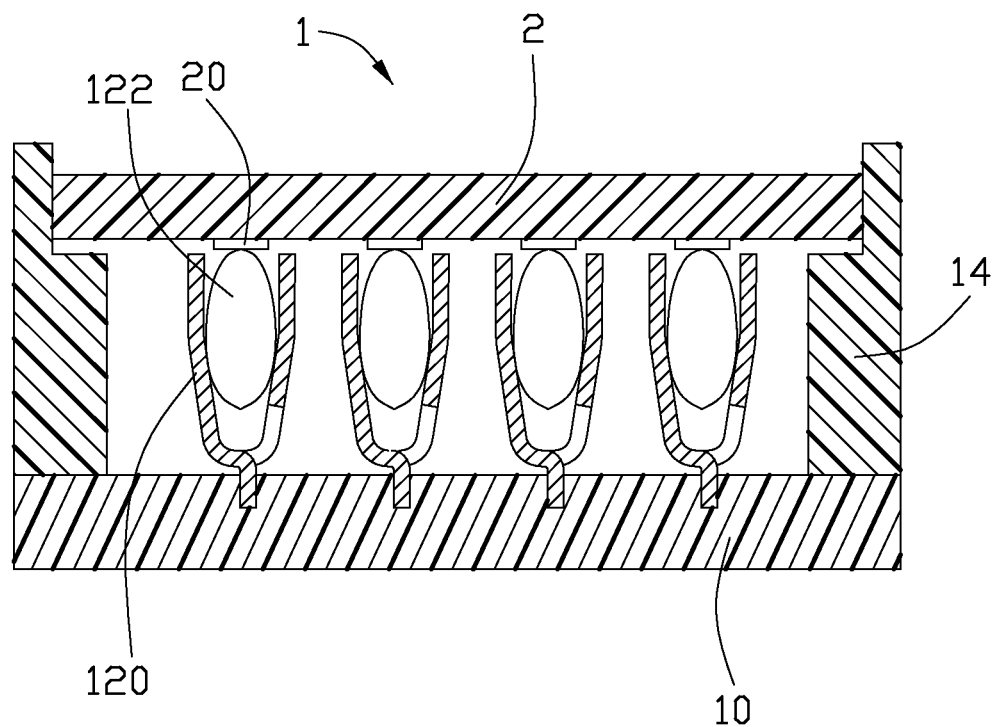
FIG. 4 is similar to FIG. 3, showing the contact unit being deformed when the electronic component is pressed toward the contact unit.

The upper contact 122 is generally of a shape of ellipsoid. After the upper contact 122 is disposed into the nest of the lower contact 120. The upper contact 122 is moveable relative to the lower contact 120 when an external load is applied and released. Referring to FIGS. 3-4, bottom end 1220 of the upper contact 122 is located below the peak 1208. Main portion of the second sections 1206 of the arms 1202 are located above central portion 1202 of the upper contact 122. Distance between free ends of the two arms is greater than maximum width of the upper contact 122. Thereby, a self-locking arrangement is formed between the upper contact 122 and the lower contact 120 for limiting upward movement of the upper contact 122. Moreover, the second section 1206 each comprises two wings 1209 bending from opposite edges thereof, so as to limit upward movement of the upper contact 122 relative to the lower contact 120.

Referring to FIGS. 3-4, before the electronic component 2 is coupled to the electrical device 1, the upper contact 122 is loosely retained by the two arms 1202 of the lower contact 120. When the electronic component 2 is pushed downwardly toward the electrical device 1, the upper contact 122 is pressed downwardly toward the lower contact 120. Accordingly, the two arms 1202 of the lower contact 120 will exert elastic deformation under stress from the upper contact 1202 and then will exert elastic force. Thus, the two arms 1202 will tightly contact with the upper contact 122. Meanwhile, the upper contact 122 contacts with pad 20 on the electronic component 2. Therefore, electrical connection between the electronic component 2 and the electrical device 1 is established. When the electrical component 2 is removed from the contact unit, the upper contact 12 will move back to its original position under the elastic force from the lower contact 120.

Figure 5:
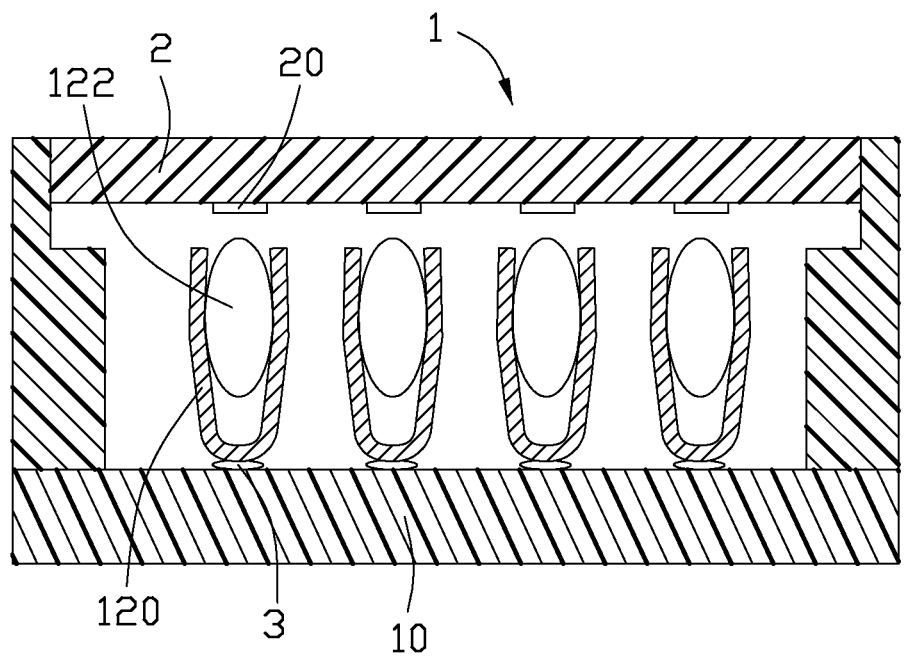
FIG. 5 is an isometric cross-sectional view of an electrical device in accordance with a second embodiment of the present invention, which shows a lower contact of the contact unit soldered to a substrate of the electrical device.

The lower contact 120 is mounted on the substrate 10, which can achieved by multiple means. Referring now to FIG. 3, a post 1210 extends from a bottom end of the base portion 1200, so as to be inserted into corresponding hole on the substrate 10. In this embodiment, the post 1210 is a split portion of the base portion 1200, which bends downwardly. Referring to FIG. 5, as an alteration, the lower contact 120 may be soldered onto the substrate 10 by solder mass 3. Accordingly, electrical connection between the contact unit 12 and the substrate 10 is established.

In order to ensure reliable electrical connection between the electronic component 2 and the contact unit 12, a position-limiting mechanism 14 may be formed on the substrate 10. The position-limiting mechanism 14 is provided with a receiving cavity for receiving the electronic component 2. The position-limiting mechanism 14 has at leas two supporting posts 140 spaced to each other and mounted on a peripheral region around the contact units 12 of the substrate 10, respectively. The supporting posts 140 each defines a step 142 thereon and steps 142 on two sidewalls jointly define a seating plane for supporting the electronic component 2.

The upper contact 122 is loosely received in the space of the lower contact 120 and upward and downward movement of the upper contact 122 are limited by the lower contact 120. Therefore, the contact unit 12 has a simple structure. Furthermore, the lower contact 120 uses two arms 1202 to achieve function of the self-locking/releasing and cost is low.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical assembly comprising:
    a board cooperating with positioning limiting mechanism to commonly define a receiving space; and
    a plurality of contact sets disposed in the receiving space, each of said contact sets defining an upper contact configured to be orbicular, and a lower contact having a lower section mounted to the board and an upper section defining a configuration essentially in compliance with the upper contact with a converged upward opening thereof; wherein
    the upper contact is snugly received and up and down moveable in the upper section with an upper end of said upper contact extending above the converged upward opening for being downwardly pressed by a corresponding pad on an underside of an electronic package under condition that the converged upward opening restrains excessive upward movement of the upper contact; and wherein
    when the upper end of the upper contact is downwardly pressed by the electronic package, a lower half of said upper contact is urged upwardly by the lower contact for restoration.

2. The electrical assembly as claimed in claim 1, wherein the positioning limiting mechanism defines a supporting face for abutting against the underside of the electronic package.

3. The electrical assembly as claimed in claim 1, wherein the upper section of the lower contact is deformed to allow downward movement of the upper contact when said upper contact is downwardly pressed by the pad of the electronic package, and resumes to an original shape to push the upper contact back to an upper position when the electronic package no longer downward presses the upper contact.

4. The electrical assembly as claimed in claim 1, wherein the lower section of the lower contact constantly urges the upper contact upwardly.

* * * * *